United States Patent
Karasawa et al.

(10) Patent No.: US 8,445,092 B2
(45) Date of Patent: May 21, 2013

(54) RESIN SHEET FOR CIRCUIT BOARDS, SHEET FOR CIRCUIT BOARDS AND CIRCUIT BOARD DISPLAYS

(75) Inventors: Yasunori Karasawa, Saitama (JP); Tatsuo Fukuda, Saitama (JP)

(73) Assignee: LINTEC Corporation, Tokyo (JP)

( * ) Notice: Subject to any disclaimer, the term of this patent is extended or adjusted under 35 U.S.C. 154(b) by 301 days.

(21) Appl. No.: 12/812,932

(22) PCT Filed: Jan. 28, 2009

(86) PCT No.: PCT/JP2009/051830
§ 371 (c)(1),
(2), (4) Date: Jul. 14, 2010

(87) PCT Pub. No.: WO2009/096593
PCT Pub. Date: Aug. 6, 2009

(65) Prior Publication Data
US 2011/0048779 A1 Mar. 3, 2011

(30) Foreign Application Priority Data

Jan. 30, 2008 (JP) ................................. 2008-018903

(51) Int. Cl.
*H05K 1/16* (2006.01)
*C08L 33/10* (2006.01)
(52) U.S. Cl.
USPC .................................. 428/67; 428/98; 428/99
(58) Field of Classification Search
USPC .............................................. 428/67, 98, 99
See application file for complete search history.

(56) References Cited

U.S. PATENT DOCUMENTS

| 4,794,133 A | 12/1988 | Moschovis et al. |
| 5,118,771 A | 6/1992 | Inoue et al. |

(Continued)

FOREIGN PATENT DOCUMENTS

| CN | 1412755 A | 4/2003 |
| CN | 1414034 A | 4/2003 |

(Continued)

OTHER PUBLICATIONS

Chinese Office Action dated Jan. 6, 2012, which issued in the Chinese patent application CN 200980103606.5, including a Japanese-language translation thereof and an English-language translation thereof.

(Continued)

*Primary Examiner* — Brent O'Hern
(74) *Attorney, Agent, or Firm* — Holtz Holtz Goodman & Chick PC

(57) ABSTRACT

A resin sheet for circuit boards (2) obtained from a macromolecular material of the energy ray curable type and used for embedding circuit chips, which has a double bond concentration of 4.5 to 25 mmol/g before being cured by irradiation with an energy ray; a sheet for circuit boards including the resin sheet for circuit boards, one face of the resin sheet being formed on a support (1); and a circuit board for displays (5) which is obtained by embedding circuit chips (3) into a face of the resin sheet for circuit boards in the sheet for circuit boards, followed by curing the resin sheet by irradiation with an energy ray. The resin sheet for circuit boards (2) can be advantageously used for producing circuit boards having embedded circuit chips for controlling each pixel of displays, in particular, flat panel displays efficiently with excellent quality and productivity.

4 Claims, 1 Drawing Sheet

U.S. PATENT DOCUMENTS

| | | | |
|---|---|---|---|
| 5,235,445 A | 8/1993 | Hirai et al. | |
| 5,356,947 A | 10/1994 | Ali et al. | |
| 5,942,578 A | 8/1999 | Noguchi et al. | |
| 5,989,778 A | 11/1999 | Hozumi | |
| 6,472,065 B1 | 10/2002 | Alapperuma et al. | |
| 6,858,316 B2 | 2/2005 | Kubota et al. | |
| 6,936,912 B2 | 8/2005 | Akiyama et al. | |
| 7,022,754 B2 | 4/2006 | Yoshimoto et al. | |
| 7,585,703 B2 | 9/2009 | Matsumura et al. | |
| 2002/0176038 A1 | 11/2002 | Watanabe et al. | |
| 2003/0083420 A1* | 5/2003 | Yoshimoto et al. | 524/494 |
| 2003/0219960 A1 | 11/2003 | Fukumoto et al. | |
| 2004/0019170 A1 | 1/2004 | Ohrui et al. | |
| 2004/0191491 A1 | 9/2004 | Sugaya et al. | |
| 2005/0245635 A1 | 11/2005 | Takeda et al. | |
| 2006/0078669 A1 | 4/2006 | Sugaya et al. | |
| 2006/0082002 A1* | 4/2006 | Arai et al. | 257/787 |
| 2009/0121303 A1 | 5/2009 | Chen et al. | |

FOREIGN PATENT DOCUMENTS

| | | |
|---|---|---|
| CN | 1430658 A | 7/2003 |
| CN | 1825572 A | 8/2006 |
| EP | 1302941 A2 | 4/2003 |
| EP | 1302941 A2 | 4/2007 |
| JP | 62-062422 A | 3/1987 |
| JP | 2001-026759 A | 1/2001 |
| JP | 2002-214588 A | 7/2002 |
| JP | 2002-309199 A | 10/2002 |
| JP | 2002-344011 A | 11/2002 |
| JP | 2003-022033 A | 1/2003 |
| JP | 2003-103696 A | 4/2003 |
| JP | 2003-207764 A | 7/2003 |
| JP | 2003-213067 A | 7/2003 |
| JP | 2003-248436 A | 9/2003 |
| JP | 2004-075904 A | 3/2004 |
| JP | 2004-219964 A | 8/2004 |
| JP | 2004-319976 A | 11/2004 |
| JP | 2005-135995 A | 5/2005 |
| JP | 2006-323335 A | 11/2006 |
| WO | WO 03/107084 A1 | 12/2003 |

OTHER PUBLICATIONS

Japanese Office Action date Jun. 28, 2011 which issued in Japanese Patent Application No. 2005-293879, and an English-language translation thereof.

Office Action issued by The State Intellectual Office of the People's Republic of China dated Feb. 5, 2008 in Chinese Application No. 2005101380, along with an English-language translation thereof.

Kawate et al., Creep Recovery of Acrylate Urethane Oligomer / Acrylate Networks, 1996, Journal of Applied Polymer Science, vol. 61, Issue 8, pp. 1413-1421.

Chigrinov, Liquid Crystal Devices: Physics and Applications, 1999, Artech House, pp. 245-246.

Office Action dated Sep. 27, 2012 issued by The State Intellectual Property Office of the People's Republic of China, which issued in Chinese Patent Application No. 200980103606.5, and an English-language translation thereof.

Office Action dated May 9, 2008 issued by The State Intellectual Property Office of the People's Republic of China for Chinese Application No. 2005101380 (including an English-language translation thereof).

* cited by examiner

RESIN SHEET FOR CIRCUIT BOARDS, SHEET FOR CIRCUIT BOARDS AND CIRCUIT BOARD DISPLAYS

This application is the United States national phase application of International Application PCT/JP2009/051830 filed Jan. 28, 2009.

TECHNICAL FIELD

The present invention relates to a resin sheet for circuit boards, a sheet for circuit boards and a circuit board for displays. More particularly, the present invention relates to a resin sheet for circuit boards and a sheet for circuit boards which are used for producing circuit boards having embedded circuit chips for controlling each pixel of displays, in particular, flat panel displays efficiently with excellent quality and productivity and exhibit excellent heat resistance after being cured, and a circuit board for displays comprising embedded circuit chips.

BACKGROUND ART

Heretofore, in flat panel displays such as, typically, liquid crystal displays, a very small electronic device such as a thin film transistor (TFT) is formed in the vicinity of each pixel constituting the face of a display in accordance with the same process as that used for producing semiconductor integrated circuits, in which insulation films, semiconductor films and the like are successively laminated, for example on a glass substrate in accordance with the CVD process (the chemical vapor deposition process), and switching on, switching off and control of the contrasting density of each pixel are conducted using the device. In other words, the very small electronic devices such as TFT are prepared directly on the glass substrate. However, the above technology has problems in that it is inevitable that the cost is increased due to the complicated process having many stages, and that the apparatus for the CVD process for forming the films on the glass substrate becomes great as the area of the display is increased, and the cost is increased markedly.

To overcome the above problems, a technology in which very small integrated circuit chips of crystalline silicon are attached to a printing plate in a manner similar to that used for printing ink, then, transferred to prescribed positions on a glass substrate for displays by a means such as printing technology and fixed there so that the cost can be decreased, is disclosed (refer, for example, to Patent Reference 1). In this technology, a film of a macromolecule is formed on the glass substrate in advance, the very small integrated circuits of crystalline silicon are transferred to the film by printing technology or the like, and the chips are embedded into the film of a macromolecule in accordance with a process such as the heat molding and the heat pressing. However, problems such as deformation of the film and formation of bubbles in the film tend to arise and, moreover, the process is not efficient due to the time required for the heating.

A sheet for circuit boards which enables to embedding circuit chips without heating by using a resin sheet for circuit boards comprising a macromolecular material of the energy curable type in place of the film of a macromolecule described above and controlling the storage moduli of the resin sheet during and after the embedding of the circuit chips, is disclosed (refer, for example, to Patent Reference 2).

A circuit board for displays having embedded circuit chips can be produced efficiently with excellent productivity by using the resin sheet for circuit boards described above. However, the cured products of the resin sheets comprising conventional macromolecular materials of the energy curable type do not always exhibit satisfactory heat resistance, and a problem arises in that cracks are formed in wiring formed on the cured products having embedded circuit chips.

[Patent Reference 1] Japanese Patent Application Laid-Open No. 2003-248436

[Patent Reference 2] Japanese Patent Application Laid-Open No. 2006-323335

DISCLOSURE OF THE INVENTION

Problems to be Overcome by the Invention

Under the above circumstances, the present invention has an object of providing a resin sheet for circuit boards and a sheet for circuit boards which are used for producing circuit hoards having embedded circuit chips for controlling each pixel of displays, in particular, flat panel displays efficiently with excellent quality and productivity and exhibit excellent heat resistance after being cured, and a circuit board for displays comprising embedded circuit chips.

Means for Overcoming the Problems

As the result of intensive studies by the present inventors to achieve the above object, it was found that the object could be achieved by using a resin sheet obtained from a macromolecular material of the energy ray curable type as the resin sheet for circuit boards and adjusting the concentration of double bond in the resin sheet before being cured by irradiation with an energy ray in a specific range. The present invention has been completed based on the knowledge.

The present invention provides:

[1] A resin sheet for circuit boards obtained from a macromolecular material of an energy ray curable type and used for embedding circuit chips; wherein said resin sheet before being cured by irradiation with an energy ray has a concentration of double bond of 4.5 to 25 mmol/g;

[2] The resin sheet for circuit boards according to [1], wherein said resin sheet after being cured by irradiation with an energy ray has a storage modulus E' of $1.0 \times 10^8$ Pa or greater at 150° C. as measured in accordance with the method of Japanese Industrial Standard K7244-4;

[3] A sheet for circuit boards comprising the resin sheet for circuit boards according to any one of [1] and [2], wherein one face of the resin sheet for circuit boards is formed on a support; and

[4]. A circuit board for displays which is obtained by embedding circuit chips into a face of the resin sheet for circuit boards in the sheet for circuit hoards according to [3], followed by curing the resin sheet for circuit boards by irradiation with an energy ray.

The Effect of the Invention

In accordance with the present invention, a circuit board for displays having embedded circuit chips which exhibits sufficient heat resistance can be obtained by using a resin sheet having a concentration of double bond in a specific range before being cured as the resin sheet for circuit boards which is obtained from a macromolecular material of the energy ray curable type and used for embedding circuit chips.

Figures 1A, 1B, 1C:
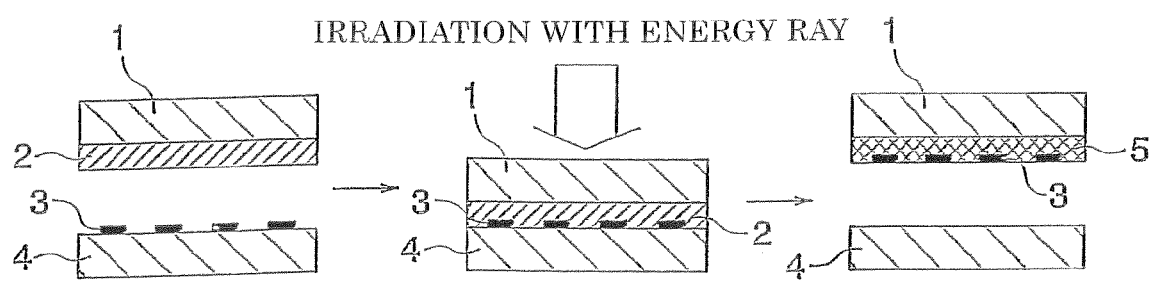
FIGS. 1(a) to 1(c) show process diagrams exhibiting an embodiment of the process for embedding circuit chips using the resin sheet for circuit boards of the present invention.

In the Figures, reference numerals mean as follows: 1: a support; 2: a resin sheet for circuit boards; 3: a circuit chip; 4: a release sheet; and 5: a circuit board for displays.

THE MOST PREFERRED EMBODIMENT TO CARRY OUT THE INVENTION

The resin sheet for circuit boards of the present invention will be described in the following.
[Resin Sheet for Circuit Boards]
The resin sheet for circuit boards of the present invention is a resin sheet for circuit boards obtained from a macromolecular material of the energy ray curable type and used for embedding circuit chips, which has a concentration of double bond of 4.5 to 25 mmol/g before being cured by irradiation with an energy ray.

When the concentration of double bond is smaller than 4.5 mmol/g, heat resistance of the cured product obtained from the resin sheet for circuit boards becomes insufficient and, as the result, cracks are occasionally formed in wiring formed on the circuit board having embedded circuit chips. On the other hand, when a resin sheet for circuit boards having a concentration of double bond exceeding 25 mmol/g is prepared, the amounts of monomers and oligomers which are low molecular components in the sheet must be increased, and the sheet tends to be deformed before being cured. It is preferable that the concentration of double bond is 5 to 20 mmol/g and more preferably 6 to 15 mmol/g. Although the reason why the formation of cracks in wiring can be prevented by using the resin sheet for circuit boards of the present invention is not completely elucidated, it is considered that the advantageous property is exhibited since the change in the dimension accompanied with the change of the temperature of the cured product of the resin sheet for circuit boards is suppressed (the temperature is elevated at 150° C. or higher during formation of the wiring and lowered at the room temperature after the wiring has been formed).

The concentration of double bond is the value obtained by the measurement in accordance with the following method.
<Method for Measuring the Concentration of Double Bond>
The concentration of double bond in the resin sheet for circuit boards is obtained by the measurement of $^1$H-NMR. Using hexamethyldisiloxane as the internal standard substance, the internal standard substance and a resin sheet for circuit boards before being cured which is used for the analysis are weighed to the order of milligram. The weighed substances are dissolved into deuterated chloroform or deuterated dimethyl sulfoxide, and the measurement of $^1$H-NMR is conducted. The amount by millimole of the functional group having double bond is obtained from the obtained spectrum. The obtained value is divided by the mass of the resin sheet for circuit boards, and the concentration of double bond (mmol/g) is obtained.

In the present invention, the concentration of double bond can be controlled by the types and the amounts of the polyfunctional polymerizable oligomers in the polymerizable oligomers and polyfunctional polymerizable monomers in the polymerizable monomers contained in the macromolecular material of the energy ray curable type, as described below.

In the resin sheet for circuit boards of the present invention, it is preferable that the storage modulus E' is $1.0 \times 10^8$ Pa or greater at 150° C. after being cured by irradiation with an energy ray. When the storage modulus E' is $1.0 \times 10^8$ Pa or greater, the resin sheet exhibits excellent heat resistance after being cured by irradiation with the energy ray, and the formation of wiring on the surface, for example, in accordance with the sputtering process is made possible.

There is no specific upper limit for the storage modulus E' at 150° C. The upper limit is, in general, $1.0 \times 10^{12}$ Pa. It is preferable that the storage modulus E' is $1.0 \times 10^8$ Pa to $1.0 \times 10^9$ Pa.

When the concentration of double bond described above is 4.5 mmol/g or greater, the storage modulus is, in general, $1.0 \times 10^8$ Pa or greater.

The storage modulus E' is the value obtained by the measurement in accordance with the following method.
<Method for Measuring the Storage Modulus E'>
A resin sheet for circuit boards is irradiated with ultraviolet light from a fusion H bulb as the light source under the condition of a luminance of 400 mW/cm$^2$ and the amount of light of 300 mJ/cm$^2$ at 25° C. to cure the resin sheet. Then, the temperature is elevated from the initial temperature of 15° C. to 150° C. at a rate of elevation of 3° C./min, and the storage modulus E' is measured at 150° C. at a frequency of 11 Hz in accordance with the method of Japanese Industrial Standard K7244-4 using an apparatus for measuring the dynamic modulus [manufactured by TA INSTRUMENTS Company; the type of the apparatus: "DMA Q800"].
<Macromolecular Material of the Energy Ray Curable Type>
In the present invention, the macromolecular material of the energy ray curable type means a macromolecular material which can be cured by irradiation with a ray having energy quantum among electromagnetic waves and beams of charged particles such as ultraviolet light and electron beams.

Examples of the macromolecular material of the energy ray curable type include (1) macromolecular materials comprising an acrylic polymer, at least one of polymerizable oligomers and polymerizable monomers of the energy ray curable type and, where desired, a photopolymerization initiator; and (2) macromolecular materials comprising an acrylic polymer of the energy ray curable type having polymerizable unsaturated groups at side chains and, where desired, a photopolymerization initiator.

Examples of the macromolecular material of (1) described above preferably include (meth)acrylic acid ester-based copolymers such as polymers of (meth)acrylic acid esters having 1 to 20 carbon atoms in the alkyl group in the ester portion and copolymers of (meth)acrylic acid esters and monomers used where desired which are monomers having functional groups having active hydrogen and other monomers. In the present invention, "(meth)acrylic acid . . . " means both of "acrylic acid . . . " and "methacrylic acid . . . ".

Examples of the (meth)acrylic acid esters having 1 to 20 carbon atoms in the alkyl group in the ester portion include methyl(meth)acrylate, ethyl(meth)acrylate, propyl(meth)acrylate, butyl(meth)acrylate, pentyl(meth)acrylate, hexyl(meth)acrylate, cyclohexyl(meth)acrylate, 2-ethylhexyl(meth)acrylate, isooctyl(meth)acrylate, decyl(meth)acrylate, dodecyl(meth)acrylate, myristyl(meth)acrylate, palmityl(meth)acrylate and stearyl(meth)acrylate. The above (meth)acrylic acid ester may be used singly or in combination of two or more.

Examples of the monomer having functional groups having active hydrogen which is used where desired include (meth)acrylic acid hydroxyalkyl esters such as 2-hydroxyethyl(meth)acrylate, 2-hydroxypropyl(meth)acrylate, 3-hydroxypropyl(meth)acrylate, 2-hydroxybutyl(meth)acrylate, 3-hydroxybutyl(meth)acrylate and 4-hydroxybutyl(meth)acrylate; monoalkylaminoalkyl(meth)acrylates such as monomethylaminoethyl(meth)acrylate, monoethylaminoethyl(meth)acrylate, monomethylaminopropyl(meth)acrylate and monoethylaminopropyl(meth)acrylate; and ethylenically unsaturated carboxylic acids such as acrylic acid, methacrylic acid, crotonic acid, maleic acid, itaconic acid and citraconic acid. The above monomer may be used singly or in combination of two or more.

In the (meth)acrylic acid ester-based copolymer, the unit of the (meth)acrylic acid ester is contained in an amount of 5 to 100% by mass and preferably 50 to 95% by mass, and the unit of the monomer having functional groups having active hydrogen is contained in an amount of 0 to 95% by mole and preferably 5 to 50% by mole.

Examples of the other monomer which is used where desired include vinyl esters such as vinyl acetate and vinyl propionate; olefins such as ethylene, propylene and isobutylene; halogenated olefins such as vinyl chloride and vinylidene chloride; styrene-based monomers such as styrene and α-methylstyrene; diene-based monomers such as butadiene, isoprene and chloroprene; nitrile-based monomers such as acrylonitrile and methacrylonitrile; and acrylamides such as acrylamide, N-methylacrylamide and N,N-dimethylacrylamide. The above monomer may be used singly or in combination of two or more. The unit of the above monomer may be contained in the (meth)acrylic acid ester-based copolymer in an amount of 0 to 30% by mass.

In the macromolecular material, the form of copolymerization of the (meth)acrylic acid ester-based copolymer used as the acrylic polymer is not particularly limited and may be any of a random copolymer, a block copolymer and a graft copolymer. It is preferable that the molecular weight is 30,000 or greater as the weight-average molecular weight.

The weight-average molecular weight described above is the value obtained by the measurement of the gel permeation chromatography (GPC) and expressed as the value of the corresponding polystyrene used as the reference material.

In the present invention, the (meth)acrylic acid ester-based copolymer may be used singly or in combination of two or more.

Examples of the polymerizable oligomer of the energy ray curable type include polyester acrylate-based oligomers, epoxy acrylate-based oligomers, urethane acrylate-based oligomers, polyether acrylate-based oligomers, polybutadiene acrylate-based oligomers, silicone acrylate-based oligomers and polyol acrylate-based oligomers. The polyester acrylate-based oligomer can be obtained, for example, by obtaining a polyester having hydroxyl group at both ends by condensation of a polybasic carboxylic acid and a polyhydric alcohol, followed by esterification of hydroxyl groups in the obtained polyester with (meth)acrylic acid, or by obtaining an oligomer by addition of an alkylene oxide to a polybasic carboxylic acid, followed by esterification of hydroxyl groups at the ends of the obtained oligomer with (meth)acrylic acid. The epoxy acrylate-based oligomer can be obtained, for example, by esterification of oxirane ring in an epoxy resin of the bisphenol type or an epoxy resin of the novolak type having a relatively low molecular weight by the reaction with (meth) acrylic acid. Epoxy acrylate-based oligomers of the carboxyl modification type which are obtained by partial modification of the epoxy acrylate-based oligomer with an anhydride of a dibasic carboxylic acid can also be used. The urethane acrylate-based oligomer can be obtained, for example, by obtaining a polyurethane oligomer by the reaction of a polyether polyol or a polyester polyol with a polyisocyanate, followed by esterification of the obtained polyurethane oligomer with (meth)acrylic acid. The polyol acrylate-based oligomer can be obtained, for example, by esterification of hydroxyl group in a polyether polyol with (meth)acrylic acid.

In the present invention, to adjust the concentration of double bond in the resin sheet for circuit boards and the storage modulus E' of the resin sheet at 150° C. after being cured with an energy ray within the specific ranges described above, highly branched oligomers having many polymerizable groups at side chains are preferable as the polymerizable oligomer. For example, (meth)acrylates of highly branched polyols are preferable.

It is preferable that the weight-average molecular weight of the polymerizahie oligomer is selected in the range of 500 to 100,000, more preferably in the range of 1,000 to 70,000 and most preferably in the range of 3,000 to 40,000 as obtained by the measurement of GPC and expressed as the value of the corresponding polystyrene used as the reference material.

The weight-average molecular weight described above is the value obtained by the measurement of the gel permeation chromatography (GPC) and expressed as the value of the corresponding polystyrene used as the reference material. The weight-average molecular weight is obtained under the following condition throughout the present invention unless otherwise mentioned.

Apparatus: an apparatus for measuring GPC [manufactured by TOSO Corporation; the trade name: "HLC-8020 CHROMATOGRAPHY"]

Columns: [manufactured by TOSO Corporation; the trade name: "TSKGEL GMHXL" (two columns) and "TSK-GEL G2000HXL" (one column)]

Solvent for elution: tetrahydrofuran

Concentration: 1%

Injected amount: 80 μl

Temperature: 40° C.

Flow rate: 1.0 ml/minute

The polymerizable oligomer may be used singly or in combination of two or more.

As the polymerizable monomer of the energy ray curable type, polyfunctional (meth)acrylic acid esters are preferable based on the same reasons as those described above. Examples of the polyfunctional (meth)acrylic acid ester include di(meth)acrylic acid 1,4-butanediol ester, di(meth) acrylic acid 1,6-hexanediol ester, di(meth)acrylic acid neopentyl glycol ester, di(meth)acrylic acid polyethylene glycol ester, di(meth)acrylic acid neopentyl glycol adipate ester, di(meth)acrylic acid hydroxypivalic acid neopentyl glycol ester, dicyclopentanyl di(meth)acrylate, caprolactone-modified dicyclopentenyl di(meth)acrylate, di(meth)acrylic acid ethylene oxide-modified phosphoric acid ester, allyl-modified cyclohexyl di(meth)acrylate, di(meth)acrylic acid isocyanurate, dimethyloltricyclodecane di(meth)acrylate, tri (meth)acrylic acid trimethylolpropane ester, tri(meth)acrylic acid dipentaerythritol ester, tri(meth)acrylic acid propionic acid-modified dipentaerythritol ester, tri(meth)acrylic acid pentaerythritol ester, tri(meth)acrylic acid propylene oxide-modified trimethylolpropane ester, tris(acryloxyethyl) isocyanurate, penta-(meth)acrylic acid propionic acid-modified dipentaerythritol ester, hexa(meth)acrylic acid dipentaerythritol ester, hexa(meth)acrylic acid caprolactone-modified dipentaerythritol ester, caprolactone-modified tris(acryloxyethyl) isocyanurate and tripentaerythritol hepta(meth)acrylate. The polymerizable monomer may be used singly or in combination of two or more.

The amounts of the polymerizable oligomer and the polymerizable monomer are selected so that the concentration of double bond in the resin sheet for circuit boards before being cured is adjusted within the range described above and the storage modulus E' of the resin sheet for circuit boards after being cured by application of energy ray is preferably $1.0 \times 10^8$ Pa or greater at 150° C. In general, the polymerizable oligomer and the polymerizable monomer can be used in amounts of 3 to 400 parts by mass based on 100 parts by mass as the solid components of the (meth)acrylic acid ester-based copolymer.

In general, ultraviolet light or electron beams are used as the energy ray. When ultraviolet light is used, a photopolymerization initiator can be used. Examples of the photopolymerization include benzoin, benzoin methyl ether, benzoin ethyl ether, benzoin isopropyl ether, benzoin n-butyl ether, benzoin isobutyl ether, acetophenone, dimethylaminoacetophenone, 2,2-dimethoxy-2-phenylacetophenone, 2,2-dimethoxy-1,2-diphenylethan-1-one, 2,2-diethoxy-2-phenylacetophenone, 2-hydroxy-2-methyl-1-phenylpropan-1-one, 1-hydroxycyclohexyl phenyl ketone, 2-methyl-1-[4-(methylthio)phenyl]-2-morpholino-propan-1-one, 4-(2-hydroxyethoxy)phenyl 2-(hydroxy-2-propyl) ketone, benzophenone, p-phenylbenzophenone, 4,4'-diethylaminobenzophenone, dichlorobenzophenone, 2-methylanthraquinone, 2-ethylanthraquinone, 2-tert-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylamine benzoic acid ester and oligo[2-hydroxy-2-methyl-1-[4-(1-propenyl)phenyl]propanone].
The photopolymerization initiator may be used singly or in combination of two or more.

The amount of the photopolymerization initiator is, in general, 0.1 to 10 parts by mass based on 100 parts by mass as the solid components in the macromolecular material of the energy ray curable type described above.

In the macromolecular material of (2) described above, examples of the acrylic polymer of the energy ray curable type having polymerizable unsaturated groups at side chains include polymers obtained by introducing an active point such as —COOH, —NCO, epoxy group, —OH and —NH$_2$ into the polymer chain of the acrylic polymer described above for the macromolecular material of (1), followed by introducing functional group of the energy ray curable type having a polymerizable unsaturated group into side chains of the acrylic polymer by the reaction of the active point and a compound having the polymerizable unsaturated group.

The active point can be introduced into the acrylic polymer by making a monomer or an oligomer having a functional group such as —COOH, —NCO, epoxy group, —OH and —NH$_2$ and a polymerizable unsaturated group present in the reaction system when the acrylic polymer is produced.

Specifically, when the acrylic polymer described above in the macromolecular material of (1) is produced, (meth)acrylic acid or the like is used when —COOH group is introduced; 2-(meth)acryloyloxyethyl isocyanate or the like is used when —NCO group is introduced; glycidyl(meth)acrylate or the like is used when epoxy group is introduced; 2-hydroxyethyl(meth)acrylate, mono(meth)acrylic acid 1,6-hexanediol ester or the like is used when —OH group is introduced; and N-methyl(meth)acrylamide or the like is used when —NH$_2$ group is introduced.

As the compound having a polymerizable unsaturated group used for the reaction with the active point, a suitable compound can be selected, for example, from 2-(meth)acryloxyethyl isocyanate, glycidyl(meth)acrylate, mono(meth)acrylic acid pentaerythritol ester, mono(meth)acrylic acid dipentaerythritol ester and mono(meth)acrylic acid trimethylolpropane ester in accordance with the type of the active point.

The acrylic polymer in which the functional group of the energy ray curable type having a polymerizable unsaturated group is introduced into side chains of the acrylic polymer via the active point can be obtained as described above.

It is preferable that the acrylic polymer of the energy ray curable type has a weight-average molecular weight of 30,000 or greater and more preferably 50,000 or greater. The weight-average molecular weight described above is the value obtained by the measurement of GPC and expressed as the value of the corresponding polystyrene used as the reference material.

As the photopolymerization initiator used where desired, photopolymerization initiators such as those described as the examples in the description for the macromolecular material of (1) can be used.

In the present invention, the material of the energy ray curable type may comprise inorganic fine particles so that contraction of the volume of the obtained resin sheet for circuit boards during curing with the energy ray is suppressed, and the heat resistance is improved.

As the inorganic fine particles, for example, fine particles of oxides and carbides of various metal elements such as silicon, titanium, zirconium, tin, aluminum and iron can be used. Among these fine particles, silica-based fine particles are preferable from the standpoint of the balance between the effect of suppressing contraction of the volume, the property of transmitting light and the economy.

In the present invention, the inorganic fine particles may be used singly or in combination of two or more. It is preferable that the average diameter of the particles is in the range of 3 to 50 nm and more preferably in the range of 5 to 30 nm from the standpoint of the transparency, the property for uniform dispersion and the effect of suppressing contraction of the volume. The average diameter of the particles is the value obtained in accordance with the BET method.

When the silica-based fine particles are used, an organosilica sol in which silica-based fine particles are dispersed in an organic solvent such as an alcohol-based solvent and a cellosolve-based solvent is preferable.

In the present invention, inorganic fine particles treated by surface modification may be used so that secondary aggregation is suppressed and the inorganic fine particles are uniformly dispersed in the macromolecular material of the energy ray curable type. The process for the surface modification is not particularly limited. Examples of the process for the surface modification include conventional processes such as the processes using an organosilane compound and the processes using a surfactant. It is preferable that the process for the surface modification is suitably selected in accordance with the type of the inorganic fine particles and the type of the macromolecular material of the energy ray curable type. For example, when silica-based fine particles are used as the inorganic fine particle, it is advantageous that the surface modification is conducted using an organosilane compound and, when inorganic fine particles other than the silica-based fine particles are used, it is advantageous that the surface modification is conducted using a surfactant.

To the macromolecular material of the energy ray curable type of (1) and (2) described above, where desired, crosslinking agents, tackifiers, antioxidants, ultraviolet light absorbers, light stabilizers and softeners may be added as long as the effect of the present invention is not adversely affected.

Examples of the crosslinking agent include polyisocyanate compounds, epoxy resins, melamine resins, urea resins, dialdehydes, methylol polymers, aziridine-based compounds, metal chelate compounds, metal alkoxides and metal salts. Among these crosslinking agents, polyisocyanate compounds are preferable. The crosslinking agent can be used in an amount of 0 to 30 parts by mass based on 100 parts by mass as the solid components of the (meth)acrylic acid ester-based copolymer.

Examples of the polyisocyanate compound include aromatic polyisocyanates such as tolylene diisocyanate, diphenylmethane diisocyanate and xylylene diisocyanate; aliphatic polyisocyanates such as hexamethylene diisocyanate; alicyclic polyisocyanates such as isophorone diisocyanate and hydrogenated diphenylmethane diisocyanate; biuret compounds and isocyanurate compounds based on these polyisocyanates; and adducts as the reaction products with low molecular weight compounds having active hydrogen such as ethylene glycol, propylene glycol, neopentyl glycol, trimethylolpropane and castor oil. The crosslinking agent may be used singly or in combination of two or more.

In the macromolecular materials of the energy ray curable type of (1) and (2), the acrylic polymer of the energy ray curable type having polymerizable unsaturated groups at side chains of (2) may be added to the macromolecular material of the energy ray curable type of (1) so that the concentration of double bond in the resin sheet for circuit boards and the storage modulus E' of the resin sheet after being cured can be controlled. Similarly, the acrylic polymer, the polymerizable oligomer of the energy ray curable type or the polymerizable monomer of the energy ray curable type of (1) may be added to the macromolecular material of the energy ray curable type of (2).

(Process for Producing a Resin Sheet for Circuit Boards)

Embodiments of the process for producing a resin sheet for circuit boards of the present invention will be described in the following. However, the present invention is not limited to the embodiments described in the following.

The resin sheet for circuit boards can be formed on a release sheet by coating a layer of a releasing agent in the release sheet with a coating fluid containing the macromolecular material of the energy ray curable type in a concentration adjusted at a suitable value in accordance with a conventional process such as the knife coating process, the roll coating process, the bar coating process, the blade coating process, the die coating process or the gravure coating process in an amount such that a layer having a prescribed thickness is formed after being dried, followed by drying the formed coating film. The release sheet may be kept without being removed after the coating so that the resin sheet for circuit boards can be stored or protected. The other face of the resin sheet for circuit boards may be laminated with another release sheet having a releasing force different from the releasing force of the release sheet described above or may be used for the preparation of the sheet for circuit boards described below without additional lamination.

The thickness of the resin sheet for circuit boards is, in general, about 50 to 1,000 μm and preferably 80 to 500 μm although the thickness is different depending on the condition of the use. To obtain a resin sheet for circuit boards having a great thickness, a plurality of resin layers prepared in accordance with the process for producing a resin sheet for circuit boards described above may be laminated, and the resin sheet for circuit boards having the desired thickness can be formed.

The release sheet described above is not particularly limited. Examples of the release sheet include release sheets obtained by coating a polyolefin film such as a polyethylene film and a polypropylene film or a polyester film such as a polyethylene terephthalate film with a releasing agent such as a silicone resin to form a layer of a releasing agent. The thickness of the release sheet is, in general, about 20 to 150 μm.

[Sheet for Circuit Boards]

The sheet for circuit boards of the present invention will be described in the following. The sheet for circuit boards of the present invention has a structure such that one face of the resin sheet for circuit boards described above is formed on a support. The construction of the resin sheet for circuit boards described above such as preferable formulations are as described above.

The support is not particularly limited. A support can be suitably selected as desired from transparent supports conventionally used as the support for displays. Examples of the support include glass substrates and plastic supports having a plate shape or a film shape. As the glass support, for example, a support comprising soda lime glass, glass containing barium-strontium, aluminosilicate glass, lead borosilicate glass, barium borosilicate glass or quartz can be used. As the plastic support having a plate shape or a film shape, for example, support comprising a polycarbonate resin, an acrylic resin, a polyethylene terephthalate resin, a polyether sulfide resin, polysulfone resin or a polycycloolefin resin can be used. The thickness of the support is suitably selected in accordance with the application. The thickness is, in general, about 20 μm to 5 mm and preferably 50 μm to 2 mm.

(Process for Producing the Sheet for Circuit Boards)

Embodiments of the process for producing the sheet for circuit boards described above will be described in the following. However, the present invention is not limited to the embodiments described in the following.

As the first embodiment of the process, when release sheets are laminated to both sides of the resin sheet for circuit boards described above, the release sheet having a smaller releasing force is removed. Then, the face exposed by the removal is laminated to the support described above, and the sheet for circuit boards is prepared.

As the second embodiment of the process, the resin sheet for circuit boards is prepared on a release sheet in accordance with the process described above. Then, the sheet for circuit boards is prepared by directly laminating the prepared resin sheet for circuit boards to the support.

As the third embodiment of the process, the sheet for circuit boards can be prepared by forming a resin sheet for circuit boards directly on the support by coating the support with the coating fluid described above in accordance with a conventional process such as the knife coating process, the roll coating process, the bar coating process, the blade coating process, the die coating process and the gravure coating process in an amount such that a coating film having a prescribed thickness is formed, followed by drying the formed coating film.

The first embodiment is preferable when a rigid support such as a glass substrate is used. The second embodiment and the third embodiment are preferable when a support such as a plastic support in the film form is used.

[Circuit Board for Displays]

The circuit board for displays of the present invention can be prepared by embedding circuit chips into the face of the resin sheet for circuit boards in the sheet for circuit boards obtained as described above, followed by curing the obtained product by irradiation with an energy ray.

The process will be described more specifically in the following. Circuit chips for embedding are placed on a release sheet or the like. The sheet for circuit boards is placed on the circuit chips in a manner such that the face having the resin sheet for circuit boards is brought into contact with the circuit chips. (When the resin sheet for circuit boards is laminated with a release sheet, the release sheet is removed in advance). The circuit chips are embedded by application of a load of about 0.05 to 2.0 MPa preferably at a temperature of 0 to 150° C. and more preferably 5 to 100° C., and the resin sheet for circuit boards is cured by irradiation with an energy ray. The release sheet on which the circuit chips are placed in the above is removed, and the circuit board for displays of the present invention can be obtained. When the circuit chips are embedded under heating, the irradiation with an energy ray can be conducted while the resin sheet for circuit boards is heated or after the resin sheet for circuit boards is cooled at the room temperature.

As the energy ray, in general, ultraviolet light or electron beams are used. Ultraviolet light is obtained from a high pressure mercury lamp, a fusion H lamp or a xenon lamp. Electron beams are obtained from an electron beam accelerator. Ultraviolet light is preferable between these energy rays. The amount of the energy ray used for the irradiation is suitably selected so that the storage modulus of the cured layer is within the range described above. For example, when ultraviolet light is used, it is preferable that the amount of light is 100 to 5,000 mJ/cm$^2$. When electron beams are used, it is preferable that the amount of irradiation is 10 to 1,000 krad.

FIGS. 1(a) to 1(c) show process diagrams exhibiting an embodiment of the process for embedding circuit chips using the resin sheet for circuit boards of the present invention.

The resin sheet for circuit boards of the present invention 2 obtained from a macromolecular material of the energy ray curable type in the uncured condition is placed on a support 1 and, separately, circuit chips 3 are placed on a release sheet 4 [(a)]. Then, the laminate of the resin sheet for circuit boards 2 and the support 1 prepared above is placed on the circuit chips 3 on the release sheet 4 in a manner such that the resin sheet for circuit boards 2 is brought into contact with the circuit chips 3. The circuit chips are embedded into the resin sheet for circuit boards under application of a load, and curing is conducted by irradiation with an energy ray [(b)]. By this operation, the resin sheet for circuit boards 2 in the uncured condition is converted into a cured layer, and the circuit chips 3 are embedded and fixed into the cured layer. The circuit board for displays of the present invention 5 can be easily separated from the release sheet 4 after this operation [(c)]. The circuit chips 3 may be placed on the resin sheet for circuit boards 2 and embedded into the resin sheet by application of a load in a similar manner.

In accordance with the process described above, the circuit chips are not embedded into a film of a macromolecule by heating but embedded into the macromolecular material of the energy ray curable type, and the curing is conducted thereafter to fix the embedded circuit chips. Therefore, the problems arising in the use of the film of a macromolecule can be prevented, and the process is efficient since the time of the operation can be decreased.

In the present invention, the circuit board for displays having embedded circuit chips which is suitable for the production in accordance with the process described above and exhibits excellent property for embedding and excellent heat resistance can be provided.

(Formation of Wiring)

In general, wiring (circuits) is formed on the surface of the circuit board for displays in which circuit chips are embedded and fixed by the curing treatment as described above.

The process for forming the wiring is not particularly limited, and a desired process can be selected from conventional processes. For example, the formation of the wiring can be conducted in accordance with the photolithography. An example of the process is as follows. The sheet for circuit boards which has embedded circuit chips and has been treated by curing is coated with a photoresist fluid of the positive type or the negative type, and a photoresist layer is formed. After the photoresist layer is exposed to light via a prescribed mask pattern, the development treatment is conducted using an alkaline developer fluid such as an aqueous solution of tetramethylammonium hydroxide, and a resist pattern is formed.

Then, a chromium film having a prescribed thickness is formed on the resist pattern formed above, for example, in accordance with the sputtering process using a chromium target as the wiring material. The obtained sheet for circuit boards is dipped into an etching fluid such as ethanol for etching the resist, and the desired wiring of chromium can be formed.

In the present invention, since the resin sheet for circuit boards exhibiting excellent heat resistance after being cured is used, problems such as formation of cracks in the wiring during formation of the wiring can be prevented.

EXAMPLES

The present invention will be described more specifically with reference to examples in the following. However, the present invention is not limited to the examples.

The properties in the Examples and Comparative Examples were evaluated in accordance with the following methods.

(1) Concentration of Double Bond in a Resin Sheet for Circuit Boards

The concentration of double bond in a resin sheet for circuit boards was measured in accordance with the method described above in the specification. From the standpoint of the solubility of the sheet, deuterated chloroform was used in Examples 1 to 5, and deuterated dimethyl sulfoxide was used in Example 6 to 8. For the measurement of $^1$H-HMR, "AVANCE 500" manufactured by Bruker BioSpin K. K. was used, and the measurement was conducted at the frequency of 500 Hz.

(2) Storage Modulus E' of a Resin Sheet for Circuit Boards at 150° C. After Being Cured with Ultraviolet Light The storage modulus E' was measured in accordance with the method described above in the specification.

As for the curing with ultraviolet light, an uncured layer was cured by irradiation with ultraviolet light using a fusion H bulb as the light source (the luminance: 400 mW/cm$^2$; the amount of light: 300 mJ/cm$^2$) unless otherwise mentioned.

(3) Heat Resistance of a Resin Sheet for Circuit Boards after being Cured with Ultraviolet Light A chromium film (a Cr film) having a thickness of 25 nm was formed on a resin sheet for circuit boards after being cured with ultraviolet light by sputtering using a chromium target.

The sputtering was conducted using an apparatus for sputtering [manufactured by Canon ANELVA Corporation; the name of the apparatus: "L-250S-FH"] under the atmosphere of argon under a pressure of film formation of 1 Pa with an electric power of 25 W.

(a) Presence or Absence of Cracks

Using a digital microscope [manufactured by KEYENCE Corporation; the trade name: "DIGITAL MICROSCOPE VHX-200"], the presence or the absence of cracks was examined at ten points arbitrarily selected on the surface of the chromium film.

The criterion for the evaluation was as follows:
good: no cracks found
poor: cracks found (b) The resistivity was measured at five points on the surface of the chromium film, and the average of the obtained values was used as the resistivity. The distance between the points of the measurement was 5 cm, and a tester [manufactured by Mitsubishi Chemical Corporation; the name of the instrument: "LORESTA MCP-T600"] was used for the measurement.

Example 1

To 100 parts by mass as the solid component of poly (methyl methacrylate) (referred to as PMMA, hereinafter) having a weight-average molecular weight of 100,000, 200 parts by mass as the solid component of a highly branched polyol acrylate [manufactured by Shin-Nakamura Chemical Co., Ltd.; the trade name: "A-HBR-5"; the weight-average molecular weight: 1,550] and 6 parts by mass as the solid component of 1-hydroxy-cyclohexyl phenyl ketone [manufactured by CIBA SPECIALTY CHEMICALS K. K.; the trade name: "IRGACURE 184"; referred to as Photopolymerization initiator A, hereinafter] as the photopolymerization initiator were mixed. The concentration of the solid components in the obtained mixture was adjusted at 50% by mass by adding methyl ethyl ketone. The resultant mixture was stirred until a homogeneous solution was obtained, and the obtained solution was used as the coating fluid.

The prepared coating fluid was applied to the face treated for releasing of a release sheet having a greater releasing force [manufactured by LINTEC Corporation; the trade name: "PLR382050*"] in which a layer of a silicone-based releasing agent is formed on one face of a polyethylene terephthalate film. The formed coating film was dried by heating at 100° C. for 90 seconds, and an uncured layer comprising the macromolecular material of the energy ray curable type having a thickness of 50 μm was formed. In accordance with a similar procedure, an uncured layer comprising the macromolecular substance of the energy curable type having a thickness of 50 μm was formed on the face treated for releasing of a release sheet having a smaller releasing force [manufactured by LINTEC Corporation; the trade name: "PET3801"] in which a layer of a silicone-based releasing agent is formed on one face of a polyethylene terephthalate film. An uncured layer having a thickness of 100 μm was formed by laminating two layers prepared above to each other, and a resin sheet for circuit boards was prepared.

Using the resin sheet for circuit boards prepared as described above, the concentration of double bond, the storage modulus at 150° C. after being cured with ultraviolet light and the heat resistance after being cured with ultraviolet light were obtained. The results are shown in Table 1.

Example 2

A resin sheet for circuit boards was prepared in accordance with the same procedures as those conducted in Example 1 except that a caprolactone-modified tris(acryloxyethyl) isocyanurate [manufactured by Shin-Nakamura Chemical Co., Ltd.; the trade name: "NK ESTER 9300-1CL"] was used in place of the highly branched polyol acrylate.

Using the resin sheet for circuit boards prepared as described above, the concentration of double bond, the storage modulus at 150° C. after being cured with ultraviolet light and the heat resistance after being cured with ultraviolet light were obtained. The results are shown in Table 1.

Example 3

A resin sheet for circuit boards was prepared in accordance with the same procedures as those conducted in Example 1 except that dimethyloltricyclodecane diacrylate [manufactured by Shin-Nakamura Chemical Co., Ltd: the trade name: "A-DCP"] was used in place of the highly branched polyol acrylate.

Using the resin sheet for circuit boards prepared as described above, the concentration of double bond, the storage modulus at 150° C. after being cured with ultraviolet light and the heat resistance after being cured with ultraviolet light were obtained. The results are shown in Table 1.

Example 4

A resin sheet for circuit boards was prepared in accordance with the same procedures as those conducted in Example 1 except that a mixture of 150 parts by mass as the solid component of dimethyloltricyclodecane diacrylate [manufactured by Shin-Nakamura Chemical Co., Ltd.; the trade name: "A-DCP"] and 50 parts by mass as the solid component of an epoxy acrylate of the bisphenol A type [manufactured by KYOEISHA CHEMICAL Co., Ltd.; the trade name; "EPDX-YESTER 3002A"] was used in place of the highly branched polyol acrylate.

Using the resin sheet for circuit boards prepared as described above, the concentration of double bond, the storage modulus at 150° C. after being cured with ultraviolet light and the heat resistance after being cured with ultraviolet light were obtained. The results are shown in Table 1.

Example 5

A resin sheet for circuit boards was prepared in accordance with the same procedures as those conducted in Example 1 except that tris(acryloxyethyl) isocyanurate [manufactured by TOAGOSEI Co., Ltd.; the trade name: "ARONIX M-315"] was used in place of the highly branched polyol acrylate.

Using the resin sheet for circuit boards prepared as described above, the concentration of double bond, the storage modulus at 150° C. after being cured with ultraviolet light and the heat resistance after being cured with ultraviolet light were obtained. The results are shown in Table 1.

Example 6

To a methyl ethyl ketone solution (the concentration of solid components: 35% by mass) of a methacrylic acid ester copolymer which was obtained from 75 parts by mass of methyl methacrylate (referred to as MMA, hereinafter) and 25 parts by mass of 2-hydroxyethyl methacrylate (referred to as HEMA, hereinafter), 2-methacryloyloxyethyl isocyanate was added in an amount of 80 equivalents based on 100 equivalents of HEMA in the copolymer. The reaction was allowed to proceed in the resultant mixture under the atmosphere of nitrogen at 40° C. for 48 hours, and an acrylic polymer of the energy ray curable type having a polymerizable unsaturated group at side chains and having a weight-average molecular weight of 150,000 was obtained. To 100 parts by mass as the solid component of the obtained acrylic copolymer of the energy ray curable type, 200 parts by mass as the solid component of a highly branched polyol acrylate [manufactured by Shin-Nakamura Chemical Co., Ltd.; the trade name: "A-HBR-5"; described above], 6 parts by mass as the solid component of 2,2-dimethoxy-1,2-diphenylethan-1-one [manufactured by CIBA SPECIALTY CHEMICALS K. K.; the trade name: "IRGACURE 651"; referred to as Photopolymerization initiator B, hereinafter] as the photopolymerization initiator and 1.5 parts by mass as the solid component of a crosslinking agent comprising polyisocyanate compounds [MITSUI CHEMICALS POLYURETHANE Co., Ltd.; the trade name: "TAKENATE D-140N", referred to as Crosslinking agent a", hereinafter] were added. Methyl ethyl ketone was added to the obtained mixture, and a coating fluid having a concentration of solid components of 40% was obtained. A resin sheet for circuit boards was prepared in accordance with the same procedures as those conducted in Example 1 except that the coating fluid obtained above was used.

Using the resin sheet for circuit boards prepared as described above, the concentration of double bond, the storage modulus at 150° C. after being cured with ultraviolet light and the heat resistance after being cured with ultraviolet light were obtained. The results are shown in Table 1.

Example 7

To the methyl ethyl ketone solution of a methacrylic acid ester copolymer of the energy ray curable type used in Example 6 in an amount of 100 parts by mass as the solid component, 200 parts by mass as the solid component of a highly branched polyol acrylate [the trade name: "A-HBR-5"; described above], 6 parts by mass as the solid component of Photopolymerization initiator B and 1.5 parts by mass as the solid component of Crosslinking agent a were added. Methyl ethyl ketone was added to the obtained mixture, and a coating fluid having a concentration of solid components of 40% was obtained. A resin sheet for circuit boards was prepared in accordance with the same procedures as those conducted in Example 1 except that the coating fluid obtained above was used.

Using the resin sheet for circuit boards prepared as described above, the concentration of double bond, the storage modulus at 150° C. after being cured with ultraviolet light and the heat resistance after being cured with ultraviolet light were obtained. The results are shown in Table 1.

Example 8

To a methyl ethyl ketone solution (the concentration of solid components: 40% by mass) of a (meth)acrylic acid ester-based copolymer which was obtained from 25 parts by mass of butyl acrylate, 50 parts by mass of methyl methacrylate and 25 parts by mass of 2-hydroxyethyl acrylate (referred to as HEA, hereinafter), 2-methacryloyloxyethyl isocyanate was added in an amount of 80 equivalents based on 100 equivalents of HEA in the copolymer. The reaction was allowed to proceed in the resultant mixture under the atmosphere of nitrogen at 40° C. for 48 hours, and an acrylic polymer of the energy ray curable type having a polymerizable unsaturated group at side chains and having a weight-average molecular weight of 250,000 was obtained. To 100 parts by mass as the solid component of the obtained acrylic copolymer of the energy ray curable type, 200 parts by mass as the solid component of a highly branched polyol acrylate [manufactured by Shin-Nakamura Chemical Co., Ltd.; the trade name: "A-HBR-5"; described above], 6 parts by mass as the solid component of Photopolymerization initiator A and 1.8 parts by mass as the solid component of Crosslinking agent a were added. Methyl ethyl ketone was added to the obtained mixture, and a coating fluid having a concentration of solid components of 40% was obtained. A resin sheet for circuit boards was prepared in accordance with the same procedures as those conducted in Example 1 except that the coating fluid obtained above was used.

Using the resin sheet for circuit boards prepared as described above, the concentration of double bond, the storage modulus at 150° C. after being cured with ultraviolet light and the heat resistance after being cured with ultraviolet light were obtained. The results are shown in Table 1.

Comparative Example 1

An uncured layer was formed in accordance with the same procedures as those conducted in Example 1 except that a urethane acrylate having the skeleton structure of polycarbonate [manufactured by The Nippon Synthetic Chemical Industry Co., Ltd: the trade name: "UV-6010EA"; the weight-average molecular weight: 1,500] was used in place of the highly branched polyol acrylate, and a resin sheet for circuit boards was prepared in accordance with the same procedures as those conducted in Example 1.

Using the resin sheet for circuit boards prepared above, the concentration of double bond, the storage modulus at 150° C. after being cured with ultraviolet light and the heat resistance after being cured with ultraviolet light were obtained. The results are shown in Table 1.

Comparative Example 2

An uncured layer was formed in accordance with the same procedures as those conducted in Example 1 except that a urethane acrylate having the skeleton structure of polycarbonate [manufactured by The Nippon Synthetic Chemical Industry Co., Ltd.; the trade name: "UV-6020EA"; the weight-average molecular weight: 1,560] was used in place of the highly branched polyol acrylate, and a resin sheet for circuit boards was prepared in accordance with the same procedures as those conducted in Example 1.

Using the resin sheet for circuit boards prepared above, the concentration of double bond, the storage modulus at 150° C. after being cured with ultraviolet light and the heat resistance after being cured with ultraviolet light were obtained. The results are shown in Table 1.

TABLE 1

| | Formulation (amount in part by mass as solid component) | | | | | | |
|---|---|---|---|---|---|---|---|
| | main component | | ultraviolet light curable resin | | photopolymerization initiator | | Crosslinking agent a |
| | type | part by mass | type | part by mass | type | part by mass | part by mass |
| Example 1 | PMMA | 100 | A-HBR-5 | 200 | A | 6 | 0 |
| Example 2 | PMMA | 100 | 9300-1CL | 200 | A | 6 | 0 |
| Example 3 | PMMA | 100 | A-DCP | 200 | A | 6 | 0 |
| Example 4 | PMMA | 100 | A-DCP/ 3002A | 150/50 | A | 6 | 0 |

TABLE 1-continued

| | | | | | | | | |
|---|---|---|---|---|---|---|---|---|
| Example 5 | PMMA | 100 | M-315 | 200 | A | 6 | 0 | |
| Example 6 | MMA:HEMA = 75:25 (MOI 80 eq) | 100 | A-HBR-5 | 200 | B | 6 | 1.5 | |
| Example 7 | MMA:HEMA = 75:25 | 100 | A-HBR-5 | 200 | B | 6 | 1.5 | |
| Example 8 | BA:MMA:HEA = 25:50:25 (MOI 80 eq) | 100 | A-HBR-5 | 200 | A | 6 | 1.8 | |
| Comparative Example 1 | PMMA | 100 | UV-6010EA | 200 | A | 6 | 0 | |
| Comparative Example 2 | PMMA | 100 | UV-6020EA | 200 | A | 6 | 0 | |

| | Result of evaluation of sheet | | | |
|---|---|---|---|---|
| | concentration of double bond (mmol/g) | storage modulus E' (Pa, 150° C.) | presence or absence of cracks on Cr film | resistivity of Cr film (Ω/□) |
| Example 1 | 6.7 | $2.7 \times 10^8$ | good | 89 |
| Example 2 | 7.4 | $1.5 \times 10^8$ | good | 67 |
| Example 3 | 10.2 | $5.5 \times 10^8$ | good | 76 |
| Example 4 | 8.0 | $2.7 \times 10^8$ | good | 59 |
| Example 5 | 7.9 | $2.4 \times 10^8$ | good | 91 |
| Example 6 | 7.9 | $4.9 \times 10^8$ | good | 71 |
| Example 7 | 6.9 | $1.7 \times 10^8$ | good | 83 |
| Example 8 | 8.5 | $3.4 \times 10^8$ | good | 64 |
| Comparative Example 1 | 3.8 | $1.3 \times 10^7$ | poor | $2.0 \times 10^7 <$ |
| Comparative Example 2 | 3.4 | $1.6 \times 10^7$ | poor | $2.0 \times 10^7 <$ |

(The ratio in the main component: ratio of amounts by mass)
Notes:
PMMA: poly(methyl methacrylate)
MMA: methyl methacrylate
BA: butyl acrylate
HEMA: 2-hydroxyethyl methacrylate
HEA: 2-hydroxyethyl acrylate
MOI: 2-methacryloyloxyethyl isocyanate
A-HBR-5: a highly branched polyol acrylate [manufactured by Shin-Nakamura Chemical Co., Ltd.; the trade name: "A-HBR-5"]
9300-1CL: a caprolactone-modified tris(acryloxyethyl) isocyanurate [manufactured by Shin-Nakamura Chemical Co., Ltd.; the trade name: "NK ESTER 9300-1CL"]
A-DCP: dimethyloltiricyclodecane diacrylate [manufactured by Shin-Nakamura Chemical Co., Ltd.; the trade name: "A-DCP"]
3002A: an epoxy acrylate of the bisphenol A type [manufactured by KYOEISHA CHEMICAL Co., Ltd.; the trade name: "EPOXYESTER 3002A"]
M-315: tris(acryloxyethyl) isocyanurate [manufactured by TOA GOSEI Co., Ltd.; the trade name: "ARONIX M-315"]
UV-6010EA: a urethane acrylate having the skeleton structure of polycarbonate [manufactured by The Nippon Synthetic Chemical Industry Co., Ltd.; the trade name: "UV-6010EA"]
UV-6020EA: a urethane acrylate having the skeleton structure of polycarbonate [manufactured by The Nippon Synthetic Chemical Industry Co., Ltd.; the trade name: "UV-6020EA"]
Photopolymerization initiator A: 1-hydroxycyclohexyl phenyl ketone [manufactured by CIBA SPECIALTY CHEMICALS K. K.; the trade name: "IRGACURE 184"]
Photopolymerization initiator B: 2,2-dimethoxy-1,2-diphenylethan-1-one [manufactured by CIBA SPECIALTY CHEMICALS K. K.; the trade name: "IRGACURE 651"]
Crosslinking agent a: a polyisocyanate-based crosslinking agent [manufactured by MITSUI CHEMICALS POLYURETHANE Co., Ltd.; the trade name: "TAKENATE D-140N"]

As shown by the results in Table 1, in all of Examples 1 to 8 in which the concentration of double bond exceeded 4.5 mmol/g, the storage modulus E' at 150° C. after being cured with an energy ray exceeded $1.0 \times 10^8$ Pa, no cracks were found on the chromium films, and the resistivity showed small values.

In contrast, in Comparative Examples 1 and 2 in which the concentration of double bond was smaller than 4.5 mmol/g, the storage modulus E' at 150° C. after being cured with an energy ray was smaller $1.0 \times 10^8$ Pa, cracks were formed on the chromium films, and the resistivity showed great values.

INDUSTRIAL APPLICABILITY

The resin sheet for circuit boards of the present invention exhibits excellent heat resistance after being cured, and the circuit board in which circuit chips for controlling each pixel of displays, in particular, flat panel displays are embedded can be provided efficiently with excellent quality and productivity.

The invention claimed is:
1. A resin sheet for circuit boards comprising:
a macromolecular material capable of being cured by irradiation with an energy ray,
wherein the macromolecular material is capable of embedding circuit chips, and
the macromolecular material before being cured by irradiation with an energy ray has a concentration of double bonds of 4.5 to 25 mmol/g,
the resin sheet being formed on a release sheet by coating a layer of a releasing agent in the release sheet with a coating fluid containing the macromolecular material to form a coating film, drying the formed coating film, and optionally removing the release sheet.

2. The resin sheet for circuit boards according to claim 1, wherein when cured by irradiation with an energy ray, the macromolecular material has a storage modulus E' of $1.0 \times 10^8$ Pa or greater at 150° C. as measured in accordance with the method of Japanese Industrial Standard K7244-4.

3. A sheet for circuit boards comprising a support and the resin sheet for circuit boards according to claim 1, wherein one face of the resin sheet for circuit boards is formed on the support.

4. A sheet for circuit boards comprising a support and the resin sheet for circuit boards according to claim 2, wherein one face of the resin sheet for circuit boards is formed on the support.

* * * * *